United States Patent
Samavedam et al.

(10) Patent No.: US 9,490,759 B2
(45) Date of Patent: Nov. 8, 2016

(54) NEUTRALIZATION OF PARASITIC CAPACITANCE USING MOS DEVICE

(71) Applicant: Avago Technologies General IP (Singapore) Pte. Ltd., Singapore (SG)

(72) Inventors: Anil Samavedam, Austin, TX (US); David Bockelman, Dripping Springs, TX (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 105 days.

(21) Appl. No.: 14/288,170

(22) Filed: May 27, 2014

(65) Prior Publication Data

US 2015/0349721 A1    Dec. 3, 2015

(51) Int. Cl.
*H03F 1/14* (2006.01)
*H03F 3/45* (2006.01)
*H03F 3/193* (2006.01)
*H03F 3/24* (2006.01)

(52) U.S. Cl.
CPC ............ *H03F 3/45179* (2013.01); *H03F 1/14* (2013.01); *H03F 3/193* (2013.01); *H03F 3/245* (2013.01); *H03F 2203/45318* (2013.01); *H03F 2203/45544* (2013.01); *H03F 2203/45546* (2013.01); *H03F 2203/45562* (2013.01)

(58) Field of Classification Search
CPC .................................... H03F 1/14; H03F 3/00
USPC .................................................. 330/292, 146
See application file for complete search history.

(56) References Cited

U.S. PATENT DOCUMENTS

| | | | | |
|---|---|---|---|---|
| 5,666,303 A | * | 9/1997 | Hughes | G11C 27/028 365/149 |
| 7,403,028 B2 | * | 7/2008 | Campbell | G01R 31/2889 324/755.01 |
| 7,932,777 B1 | * | 4/2011 | Zipfel, Jr. | H02N 2/065 330/10 |
| 8,228,111 B2 | * | 7/2012 | Quinn | H03F 1/0211 327/333 |
| 8,576,007 B2 | | 11/2013 | Corsi et al. | |
| 2006/0132231 A1 | * | 6/2006 | Ishii | H03F 1/0211 330/10 |
| 2013/0015918 A1 | | 1/2013 | Wang Limketkai et al. | |

OTHER PUBLICATIONS

Jia Fei, et al. "A digitally controlled power amplifier with neutralization capacitors for Zigbee (TM) applications", Journal of Semiconductors, vol. 33, No. 2, Dec. 2012.

* cited by examiner

Primary Examiner — Henry Choe

(57) ABSTRACT

An apparatus comprises an amplifier comprising at least one metal oxide semiconductor (MOS) transistor having a parasitic gate-to-drain capacitance, and at least one MOS neutralization device having a neutralization capacitance configured to compensate for the parasitic gate-to-drain capacitance of the at least one MOS transistor.

23 Claims, 11 Drawing Sheets

NEUTRALIZATION OF PARASITIC CAPACITANCE USING MOS DEVICE

BACKGROUND

Electrical circuits may experience diminished performance due to parasitic capacitances associated with their components. For example, in power amplifiers used in wireless communication applications, parasitic capacitances may reduce the gain of radio frequency (RF) signals, resulting in detuning at an input due to output load variations and also in potential instability. To counteract parasitic capacitances, some circuits include so-called neutralization capacitances that produce a neutralization current to effectively cancel signals produced by the parasitic capacitances.

FIG. 1 is a diagram of a conventional differential amplifier 100 comprising neutralization capacitances. Differential amplifier 100 may be used as a power amplifier in communication applications and other contexts.

Referring to FIG. 1, differential amplifier 100 comprises first and second metal oxide semiconductor (MOS) transistors M1 and M2 having respective gates receiving a differential pair of input signals IN+ and IN−, respective drains receiving a differential pair of output signals OUT− and OUT+, and respective sources connected to ground. During typical operation, differential amplifier 100 receives the differential pair of input signals IN+ and IN−, and it amplifies those signals to produce the differential pair of output signals OUT+ and OUT−.

A parasitic capacitance $C_{gd}$ between the gate and drain of each of first and second MOS transistors M1 and M2 provides a feedback path that results in poor isolation between input and output, reduces the gain of differential amplifier 100, and reduces the power efficiency of differential amplifier 100. This feedback phenomenon and its consequences are commonly referred to as the Miller effect.

To counteract the Miller effect, differential amplifier 100 further comprises first and second differential neutralization capacitances $C_{dn1}$ and $C_{dn2}$, which are cross-coupled between the input and output terminals as shown in the figure. These capacitors allow a compensation current to flow between the terminals, which tends to cancel the feedback. The provision of this current is referred to as differential neutralization. In a differential sense, the presence of differential neutralization capacitances ideally reduce gate-to-drain capacitance to zero. In a common mode sense, the presence of differential neutralization capacitances effectively doubles the gate-to-drain capacitance.

Some potential benefits of differential neutralization in the illustrated context include isolation of input and output signals, which tends to simplify design, stabilization of differential amplifier 100 for any passive impedance at its inputs and outputs, and rendering the differential input impedance independent of any output load.

FIG. 2 is a diagram of a conventional H-bridge circuit 200 comprising differential neutralization capacitances. This diagram is presented as another example application of the differential neutralization concept.

Referring to FIG. 2, H-bridge circuit 200 comprises first and second negative channel MOS (NMOS) transistors N1 and N2, first and second positive channel MOS (PMOS) transistors P1 and P2, and differential neutralization capacitances $C_{dnp}$ and $C_{dnn}$. A first pair of differential neutralization capacitances $C_{dnn}$ neutralizes intrinsic gate-to-drain capacitances of an NMOS gain stage formed by NMOS transistors N1 and N2. A second pair of differential neutralization capacitances $C_{dnp}$ neutralizes intrinsic gate-to-drain capacitances of a PMOS gain stage formed by PMOS transistors P1 and P2. In the example of FIG. 2, an effective gate-to-drain capacitance can be derived for a hybrid-pi small signal model of each gain stage.

In a differential mode sense, the effective Miller capacitance of H-bridge circuit 200 can be equal to zero when $C_{dn} = C_{gd}$, i.e., where the overall differential neutralization capacitance is equal to the gate-to-drain capacitance. Under such a condition, H-bridge circuit 200 may be stable for all passive source and load terminations.

Using the hybrid-pi small signal model, the following parameters of H-bridge circuit 200 can be characterized by the following equations (1)-(4): differential input admittance ($Y_{in}$, dd), differential output admittance ($Y_{out}$, dd), common mode input admittance ($Y_{in}$, cc), and common mode output admittance ($Y_{out}$, cc).

$$Y_{in}, dd = \frac{1}{2}\left[Y_{gs} + Y_{gd} + Y_x + \frac{(Y_x - Y_{gd})(g_m - Y_{gd} + Y_x)}{Y_{ds} + Y_{gd} + Y_x}\right] \quad (1)$$

$$Y_{out}, dd = \frac{1}{2}\left[Y_{ds} + Y_{gd} + Y_x + \frac{(Y_x - Y_{gd})(g_m - Y_{gd} + Y_x)}{Y_{gs} + Y_{gd} + Y_x}\right] \quad (2)$$

$$Y_{in}, cc = 2\left[Y_{gs} + Y_{gd} + Y_x + \frac{(Y_x + Y_{gd})(g_m - Y_{gd} - Y_x)}{Y_{ds} + Y_{gd} + Y_x}\right] \quad (3)$$

$$Y_{out}, cc = 2\left[Y_{ds} + Y_{gd} + Y_x + \frac{(Y_x + Y_{gd})(g_m - Y_{gd} - Y_x)}{Y_{gs} + Y_{gd} + Y_x}\right] \quad (4)$$

In equations (1)-(4) for the hybrid-pi equivalent, $Y_{gs}$ denotes gate-to-source admittance of a single device including any external source admittance. $Y_{gd}$ denotes gate to drain (Miller) admittance for a single device. $Y_{ds}$ denotes drain-to-source admittance of a single device including any external load admittance. $Y_x$ denotes admittance of one differential neutralization capacitor. $g_m$ denotes transconductance of a single device.

In the examples of FIGS. 1 and 2, neutralization capacitances are typically implemented by metal capacitors (e.g., sidewall and overlap capacitors) or metal-insulator-metal (MIM) capacitors. These capacitors provide potential benefits in that they are mostly bias independent. In other words, they do not have a high sensitivity to a drain-source voltage $V_{ds}$ or gate-drain voltage $V_{gd}$ of the MOS devices. Accordingly, once the differential neutralization capacitances are appropriately implemented by metal or MIM capacitors, they tend to work well across different supply levels and bias conditions. A potential drawback of these capacitors, however, is that they do not track $C_{gd}$ of the MOS devices very well with process variations and die-to-die and lot-to-lot variations. This is because $C_{gd}$ of the MOS devices is determined by overlap capacitance (assuming the device is in saturation mode), which can vary significantly with small variations in the thickness of an oxide layer. Meanwhile, the metal or MIM capacitors do not have a commensurate variation according to the thickness of the oxide layer, so they may not be appropriately matched to $C_{gd}$ from die-to-die or lot-to-lot.

Accordingly, in view of these and other shortcomings of conventional technologies, there is a general need for new approaches to differential neutralization in certain contexts.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
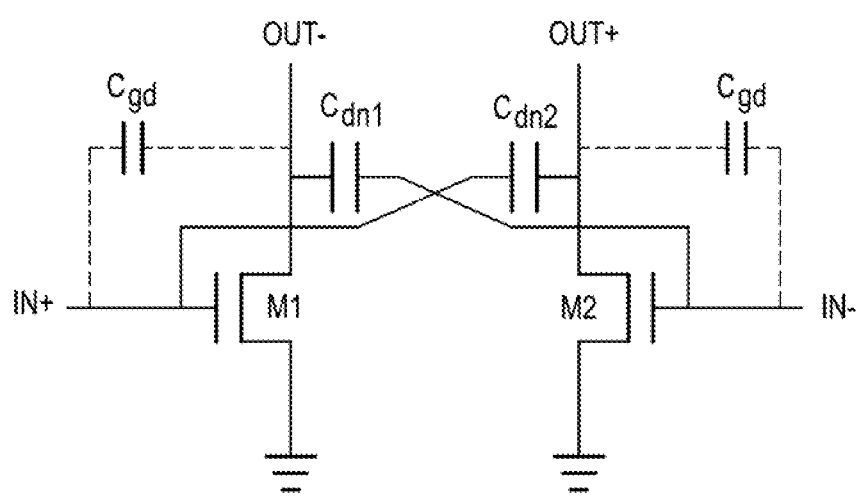
FIG. 1 is a diagram of a conventional differential amplifier comprising neutralization capacitances.

In the following detailed description, for purposes of explanation and not limitation, example embodiments disclosing specific details are set forth in order to provide a thorough understanding of the present teachings. However, it will be apparent to one having ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical, scientific, or ordinary meanings of the defined terms as commonly understood and accepted in the relevant context.

The terms 'a', 'an' and 'the' include both singular and plural referents, unless the context clearly dictates otherwise. Thus, for example, 'a device' includes one device and plural devices. The terms 'substantial' or 'substantially' mean to within acceptable limits or degree. The term 'approximately' means to within an acceptable limit or amount to one of ordinary skill in the art. Relative terms, such as "above," "below," "top," "bottom," "upper" and "lower" may be used to describe the various elements' relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be below that element. Other relative terms may also be used to indicate the relative location of certain features along a path such as a signal path. For instance, a second feature may be deemed to "follow" a first feature along a signal path if a signal transmitted along the path reaches the second feature before the second feature.

The described embodiments relate generally to apparatuses in which neutralization of parasitic capacitances is performed using MOS devices. For example, in some embodiments, a differential amplifier comprises a pair of PMOS transistors forming a first gain stage, a pair of NMOS transistors forming a second gain stage, and two pairs of MOS differential neutralization devices that are cross-coupled between input and output terminals of the first and second gain stages, as explained in further detail below. The MOS differential neutralization devices may be NMOS transistors or PMOS transistors providing a desired level of differential neutralization capacitance. They may also be native MOS devices providing the desired level of differential neutralization capacitance.

The MOS differential neutralization devices may provide relatively consistent neutralization of the parasitic capacitances associated with the first and second gain stages, because they may be formed with the same oxide layer as the PMOS and NMOS transistors in those gain stages. Consequently, when $C_{gd}$ of the PMOS and NMOS transistors experiences die-to-die or lot-to-lot variation, $C_{dn}$ of the MOS differential devices may experience commensurate variation, maintaining a relatively consistent level of neutralization.

In certain embodiments, an apparatus comprises a first PMOS transistor having a source connected to a first node, a drain connected to a second node, and a gate connected to a third node, a second PMOS transistor having a source connected to the first node, a drain connected to a fourth node, and a gate connected to a fifth node, a first NMOS transistor having a source connected to a sixth node, a drain connected to the second node, and a gate connected to a seventh node, a second NMOS transistor having a source connected to the sixth node, a drain connected to the fourth node, and a gate connected to an eighth node, a first MOS differential neutralization device connected between the third node and the fourth node, a second MOS differential neutralization device connected between the fifth node and the second node, a third MOS differential neutralization device connected between the seventh node and the fourth node, and a fourth MOS differential neutralization device connected between the eighth node and the second node.

In certain other embodiments, an apparatus comprises a differential amplifier comprising first and second MOS transistors arranged in parallel, the first MOS transistor comprising a gate that receives a positive input signal among a differential pair of input signals, a drain that outputs a negative output signal among a differential pair of output signals, and a source connected to a reference voltage, and the second MOS transistor comprising a gate that receives a negative input signal among the differential pair of input signals, a drain that outputs a positive output signal among the differential pair of output signals, and a source connected to the reference voltage, a first MOS differential neutralization device connected between the gate of the first MOS transistor and the drain of the second MOS transistor, and a second MOS differential neutralization device connected between the gate of the second MOS transistor and the drain of the first MOS transistor.

In certain other embodiments, an apparatus comprises an amplifier comprising at least one MOS transistor having a parasitic gate-to-drain capacitance, and at least one MOS neutralization device having a neutralization capacitance configured to compensate for the parasitic gate-to-drain capacitance of the at least one MOS transistor.

Figure 2:
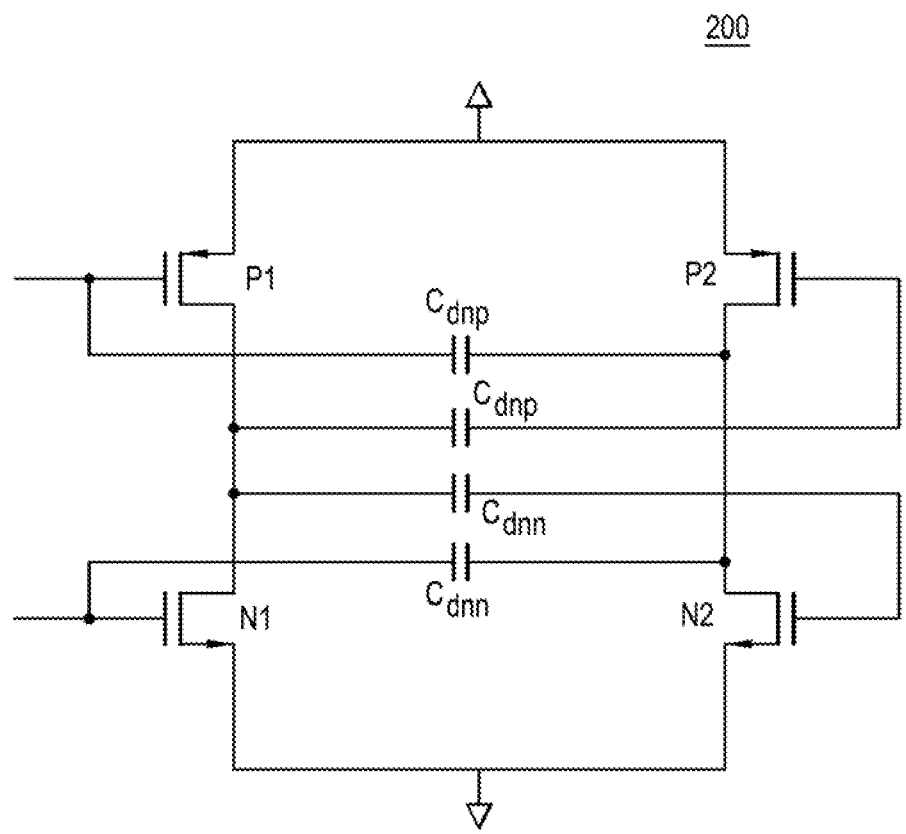
FIG. 2 is a diagram of a conventional H-bridge circuit comprising differential neutralization capacitances.
Figure 3A:
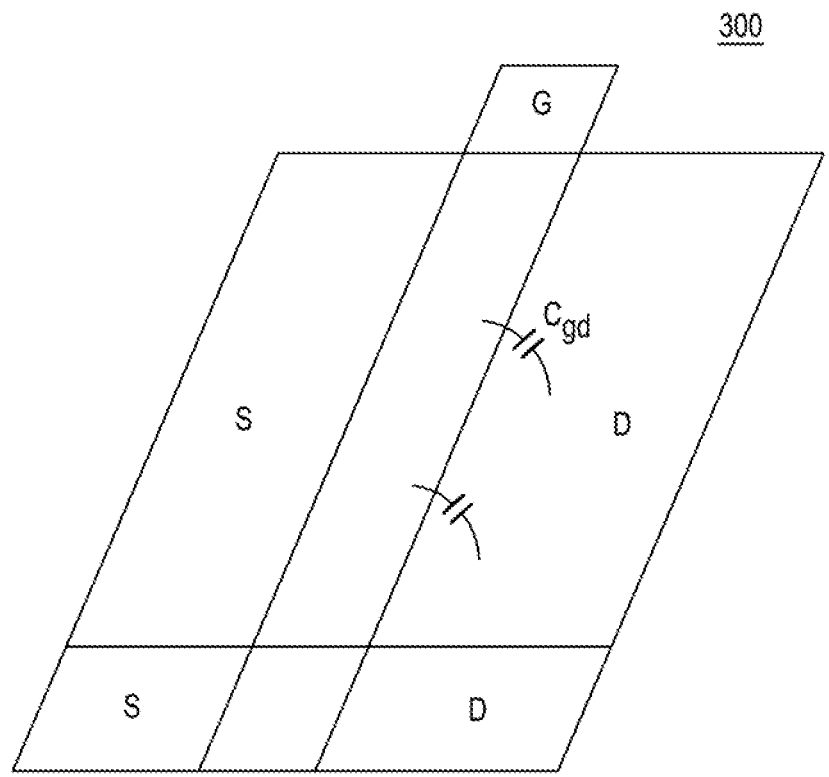
FIG. 3A is a perspective view of a MOS device that may be used as a gain element in a differential amplifier, according to a representative embodiment.
Figure 3B:
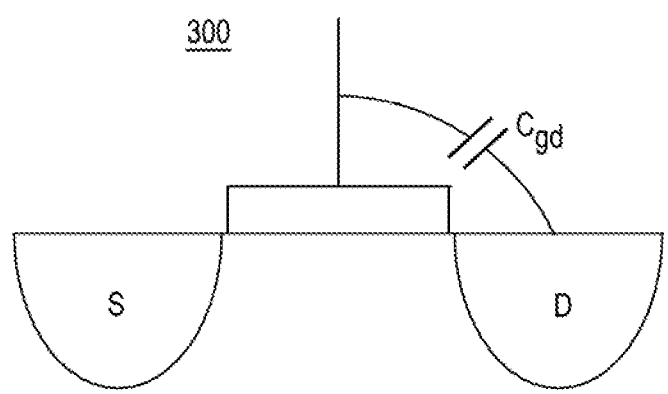
FIG. 3B is a cross-sectional view of the MOS device of FIG. 3A, according to a representative embodiment.
Figure 4A:
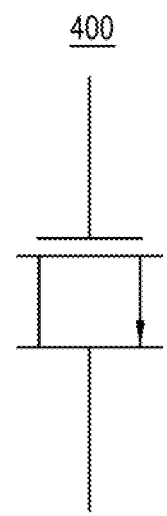
FIG. 4A is a circuit symbol for a MOS differential neutralization device, according to a representative embodiment.
Figure 4B:
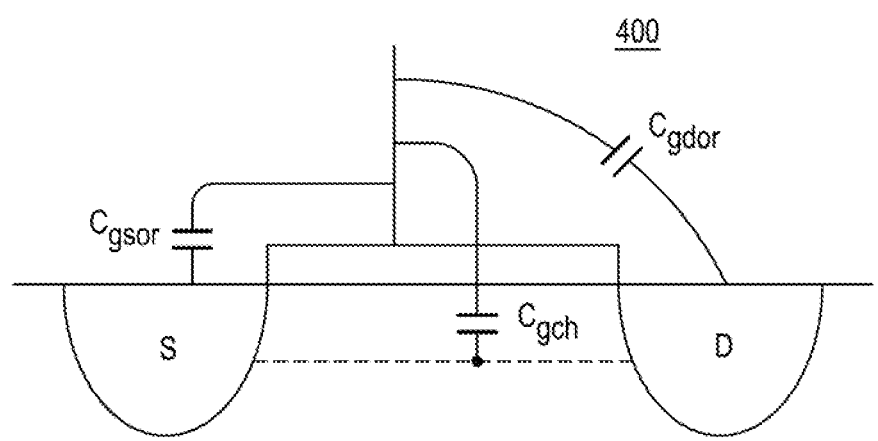
FIG. 4B is a cross-sectional view of the MOS differential neutralization device of FIG. 4A, according to a representative embodiment.

FIG. 3A is a perspective view of a MOS device 300 that may be used as a gain element in a differential amplifier, according to a representative embodiment, and FIG. 3B is a cross-sectional view of MOS device 300 of FIG. 3A, according to a representative embodiment. FIG. 4A is a circuit symbol for a MOS neutralization device 400, according to a representative embodiment, and FIG. 4B is a cross-sectional view of MOS differential neutralization device 400 of FIG. 4A, according to a representative embodiment. The gain elements and MOS differential neutralization devices of FIGS. 3 and 4 may be used, for example in circuit configurations such as those illustrated in FIGS. 1 and 2. In such circuit configurations, the MOS differential neutralization devices may be used to implement the illustrated differential neutralization capacitances $C_{dn}$.

Referring to FIGS. 3A and 3B, MOS device 300 comprises a source S, a drain D, and a gate G. Source S and drain D are formed in a substrate, and gate G is formed on an oxide layer over the substrate. The different regions constituting MOS device 300 may be doped in various alternative ways to produce an NMOS transistor or a PMOS transistor, for example.

A parasitic capacitance $C_{gd}$ exists between gate G and drain D of MOS device 300. The magnitude of parasitic capacitance $C_{gd}$ depends on the thickness of the oxide layer between the substrate and gate G, which may fluctuate based on die-to-die or lot-to-lot process variations. Accordingly, to provide a consistent level of neutralization for the parasitic capacitance $C_{gd}$, it may be beneficial to design neutralization devices whose capacitance fluctuates according to the same die-to-die or lot-to-lot process variations.

Referring to FIGS. 4A and 4B, MOS differential neutralization device 400 comprises a source S, drain D, and gate G, similar to MOS device 300. MOS neutralization device 400 is shown as an NMOS transistor, although it could be a PMOS transistor, or a native MOS transistor.

Like MOS device 300, MOS neutralization device 400 comprises an oxide layer formed between a substrate and gate G. Moreover, the oxide layer of both of these devices may be formed by the same process (e.g., the same deposition step), so it may experience the same process variations.

MOS neutralization device 400 has a gate-to-source capacitance $C_{gs}$, a gate-to-drain capacitance $C_{gd}$, a gate-to-channel capacitance $C_{gch}$, and an overall capacitance is $C_{gs}+C_{gd}+C_{gch}$. Each of the above capacitances depends on the thickness of the oxide layer in MOS neutralization device 400, so it varies with the thickness of the oxide layer according to process variations.

Because MOS neutralization device 400 and MOS device 300 each have an oxide layer whose thickness varies with the same process variations, the capacitance of MOS neutralization device 400 may vary commensurate with parasitic capacitance $C_{gd}$. Consequently, MOS neutralization device 400 may be able to provide a stable level of capacitive neutralization in spite of the process variations.

Figure 5:
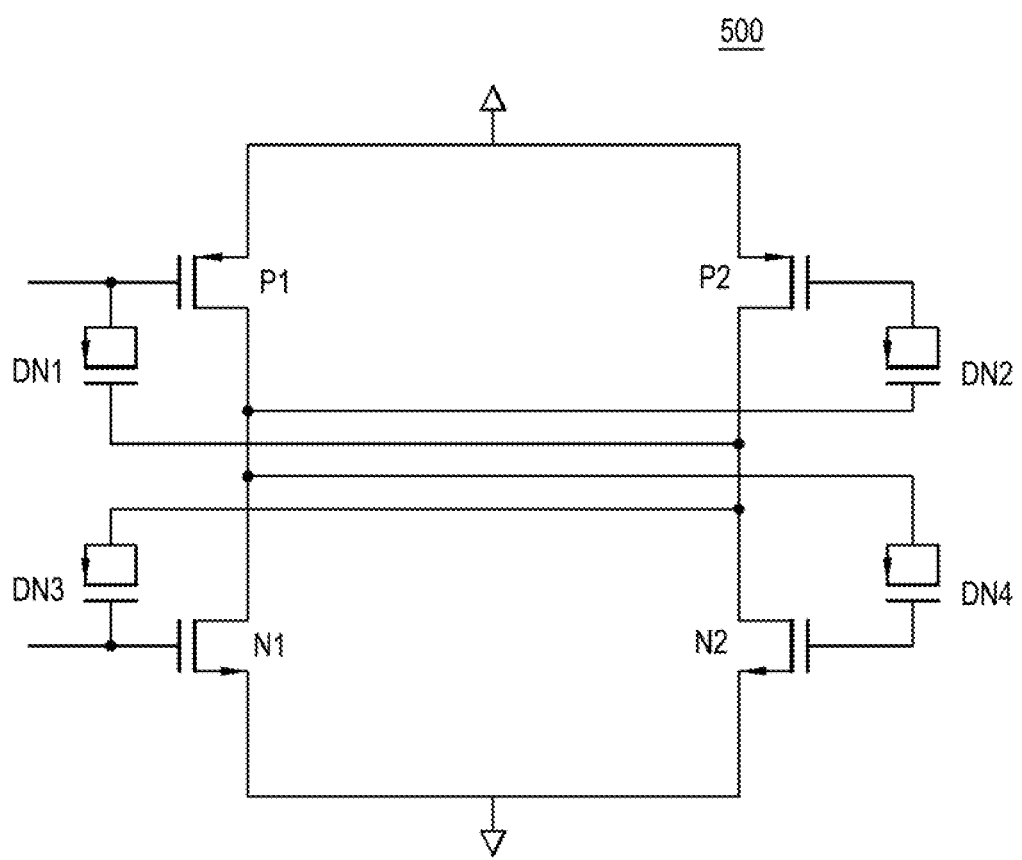
FIG. 5 is a diagram of an H-bridge circuit comprising MOS neutralization devices, according to a representative embodiment

FIG. 5 is a diagram of an H-bridge circuit 500 comprising MOS differential neutralization devices, according to a representative embodiment. Each of the MOS differential neutralization devices in FIG. 5 can be implemented in a form such as that illustrated in FIG. 4, for example.

Figure 6:
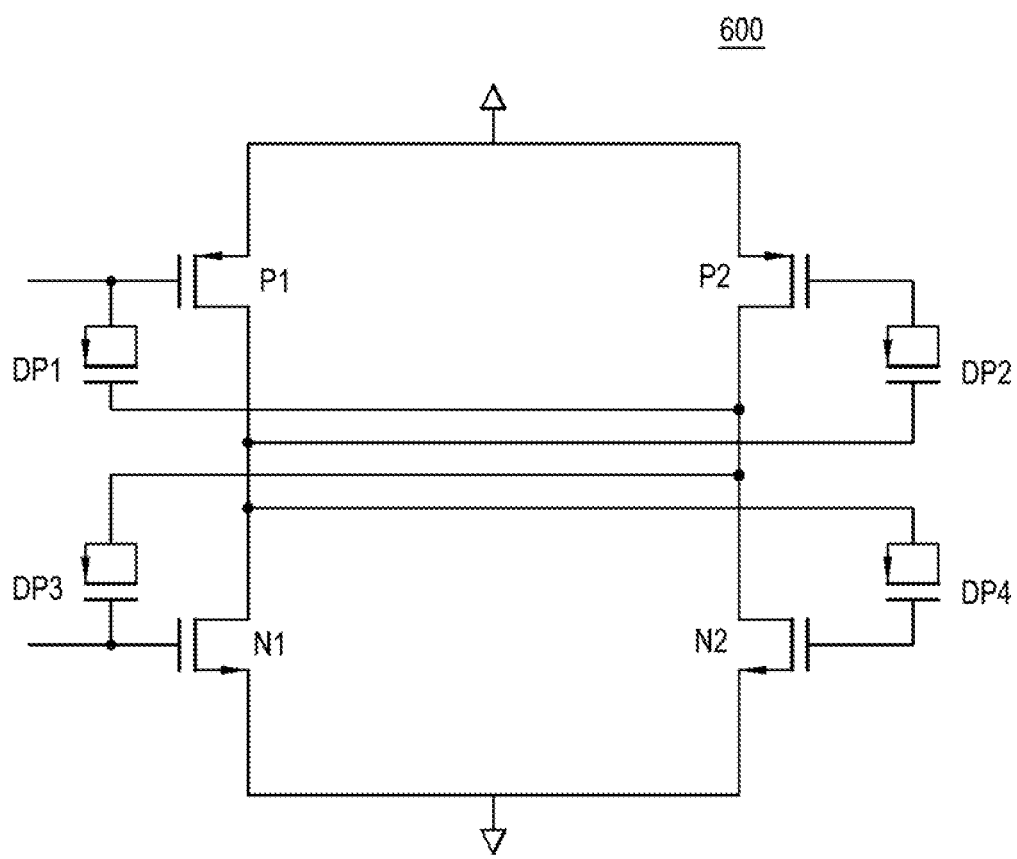
FIG. 6 is a diagram of an H-bridge circuit comprising MOS differential neutralization devices, according to a representative embodiment.

Referring to FIG. 5, H-bridge circuit 500 comprises first and second NMOS transistors N1 and N2 constituting a first amplification stage, and first and second PMOS transistors P1 and P2 constituting a second amplification stage. H-bridge circuit 500 further comprises first through fourth MOS differential neutralization devices DN1 through DN4. In the example of FIG. 5, each of the first through fourth MOS differential neutralization devices DN1 through DN4 comprises an NMOS device, e.g., an NMOS transistor. However, in alternative embodiments they could be implemented by other types of devices, such as PMOS transistors. For example, an H-bridge circuit 600 illustrated in FIG. 6 is substantially the same as that of FIG. 5, except that each of first through fourth MOS differential neutralization devices DP1 through DP4 comprises a PMOS device.

Each of the first through fourth MOS differential neutralization devices DN1 through DN4 is coupled between a gate of a corresponding transistor, and a drain of an opposing transistor in the same amplification stage. For instance, first MOS differential neutralization device DN1 is coupled between a gate of first NMOS transistor N1 and a drain of second NMOS transistor N2. As will be apparent from the foregoing description, these differential neutralization devices compensate for parasitic gate-to-drain capacitances associated with the NMOS and PMOS transistors in the first and second amplification stages shown in FIG. 5.

Although MOS neutralization devices may provide various benefits compared to conventional neutralization capacitors, they also tend to suffer from various drawbacks.

Figure 7:
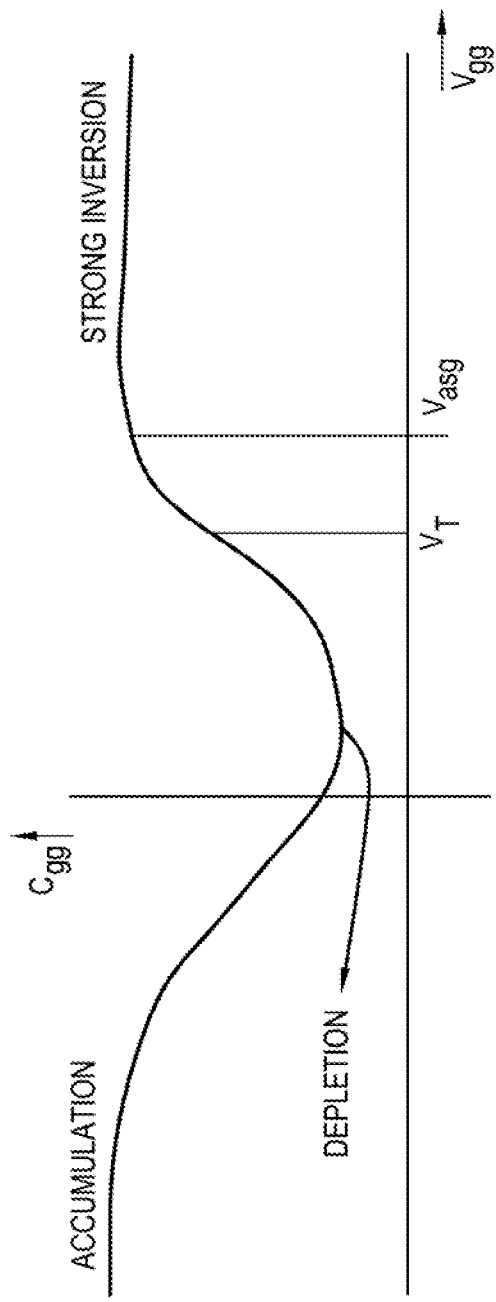
FIG. 7 is a graph of gate capacitance $C_{gg}$ as a function of gate-to-source voltage $V_{gs}$ in an NMOS transistor, according to a representative embodiment.

First, the capacitance of a MOS neutralization device may vary as a function of its threshold voltage. A typical NMOS device, for example, may have a threshold voltage $V_{th}$ on the order of 0.6V to 0.8V. A typical capacitance-voltage (CV) curve for such an NMOS device is shown in FIG. 7. As illustrated in FIG. 7, depending on bias conditions of the MOS neutralization devices and the amount of signal swing across those devices, there may be a change in capacitance versus signal swing, which can be a source of unwanted non-linearity.

Second, the operation of the MOS neutralization devices depends on a supply voltage $V_{DD}$, which can be another source of unwanted non-linearity. In H-bridge circuit 500, for example, assuming the operating point of a drain in one of the gain stages is at $V_{DD}/2$, the gate-to-source voltage $V_{gs}$ across the MOS neutralization devices is a function of supply voltage. Consequently, a curve of capacitance versus signal swing may vary as a function of the supply voltage. Moreover, if the MOS neutralization devices have their bulks tied to ground (e.g., for NMOS devices) or to $V_{DD}$ (e.g., for PMOS devices), they may experience the back gate effect, which raises the threshold voltage and also makes the threshold voltage a function of voltage supply level.

One way to address the above shortcomings is to use native MOS devices as the neutralization devices. In particular, the use of native MOS devices may reduce threshold voltage and CV curve nonlinearity, and it may reduce sensitivity to supply voltage and a back gate effect.

Figure 8:
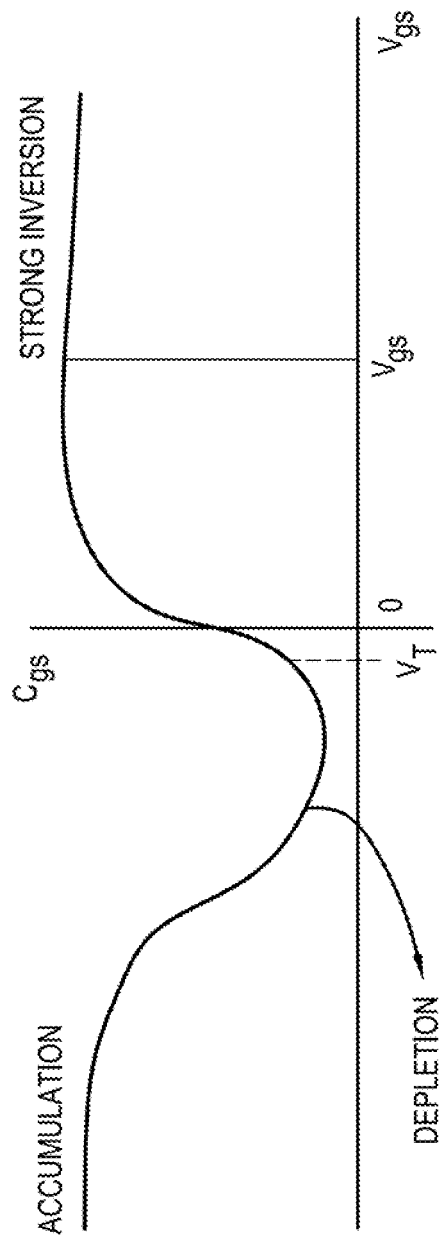
FIG. 8 is a graph of gate capacitance $C_{gg}$ as a function of gate-to-source voltage $V_{gs}$ in a native MOS device, according to a representative embodiment.

The reduction in threshold voltage and CV curve nonlinearity is illustrated by FIG. 8, which is a graph of gate capacitance $C_{gg}$ as a function of gate-to-source voltage $V_{gs}$ in a native MOS device. As illustrated in FIG. 8, the native MOS device is biased in strong inversion for larger signal amplitudes compared to a regular MOS device, such as that represented by FIG. 7. Also, in strong inversion, gate capacitance $C_{gg}$ is relatively insensitive to voltage swings. Consequently, the neutralization capacitance provided by the native MOS device is relatively constant compared to that of a regular MOS device.

The reduction in sensitivity to supply voltage and back gate effect can be understood as follows. The threshold voltage of a native MOS device is not a strong function of source-to-bulk voltage $V_{SB}$, as illustrated by the following equations (5)-(6).

$$V_{th} = V_{T0} + \gamma\left(\sqrt{(2\varphi_F + V_{SB})} - \sqrt{2\varphi_F}\right) \quad (5)$$

$$\gamma = \frac{tox}{eox}\left(\sqrt{2q\varepsilon_{Si}N_A}\right) \quad (6)$$

In equations (5)-(6), $V_{th}$ denotes threshold voltage with substrate to source bias present. $V_{T0}$ denotes threshold voltage with zero substrate to source bias. $\gamma$ denotes body effect coefficient. $2\varphi_F$ denotes surface potential. $V_{SB}$ denotes source to bulk voltage. tox denotes oxide thickness. eox denotes oxide permittivity. q denotes charge of an electron. $\varepsilon_{Si}$ denotes permittivity of silicon. $N_A$ denotes doping concentration.

The value of $N_A$ is much smaller for a native MOS device than for a regular NMOS device. Therefore, $\gamma$ is relatively small. Consequently, $V_{th}$ is not a strong function of $V_{SB}$ and therefore supply voltage. Consequently, the CV curves for the native MOS devices, which depend on channel formation and threshold voltage, are relatively insensitive to supply voltage and biasing.

Figure 9:
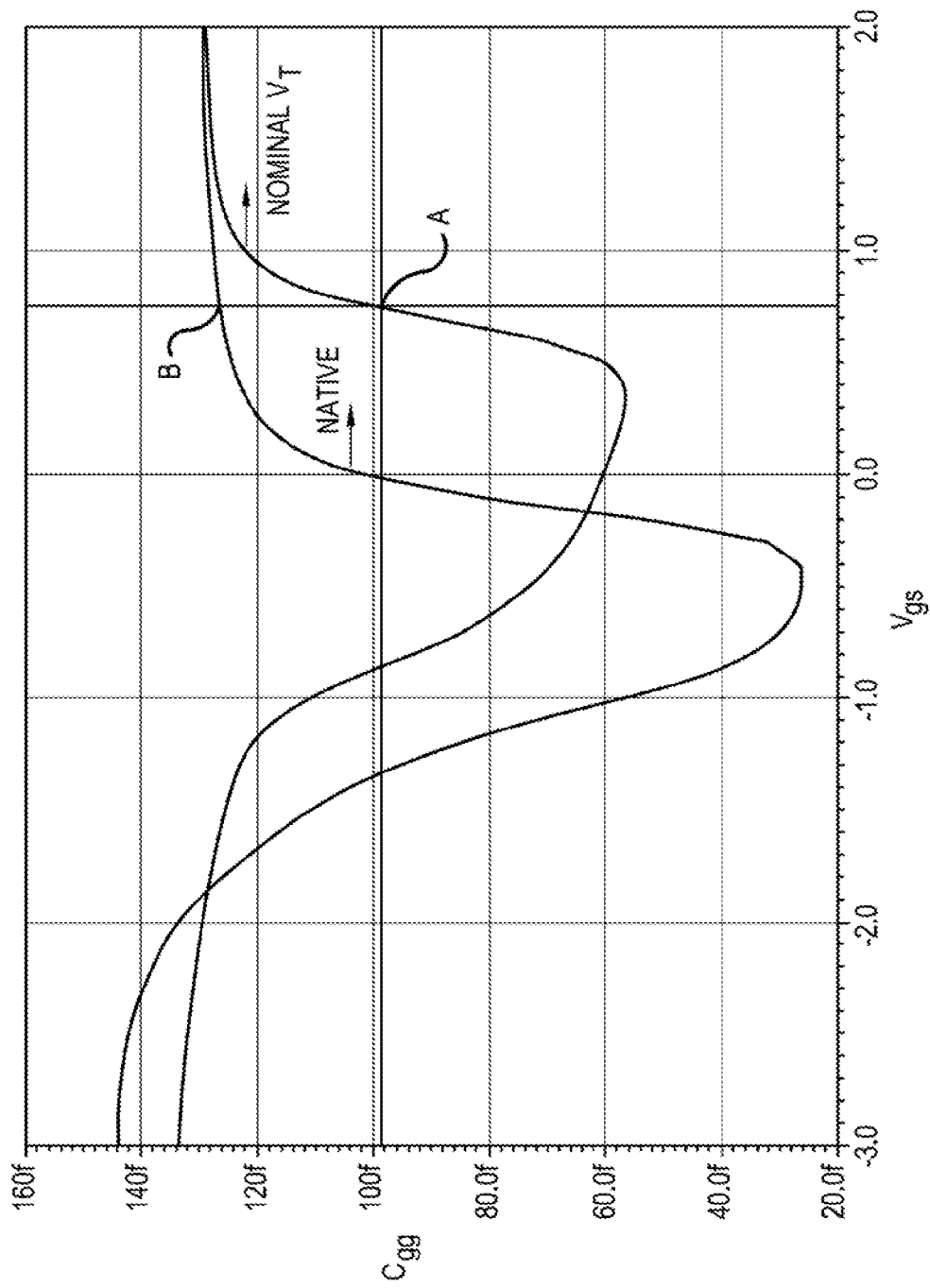
FIG. 9 is a graph illustrating a comparison between a CV curve of a native MOS device and a non-native MOS device.

FIG. 9 is a graph illustrating a comparison between a CV curve of a native MOS device and a non-native MOS device.

Referring to FIG. 9, at operating points "A" and "B", which correspond to a gate-to-source voltage of about 0.75V, the non-native MOS device is near a nominal threshold voltage $V_{th}$. At operating point "A", however, the CV curve of the non-native MOS device is rapidly changing. In other words, at that point, the gate capacitance of the Cgg changes significantly with relatively small changes in gate-to-drain voltage $V_{gd}$. On the other hand, at operating point "B", the CV curve of the native MOS device is relatively flat. In other words, at that point, the gate capacitance of the Cgg does not change significantly with relatively small changes in gate-to-drain voltage $V_{gd}$. As indicated above, this characteristic may allow the native MOS device to provide more stable performance as a neutralization capacitor.

Figure 10:
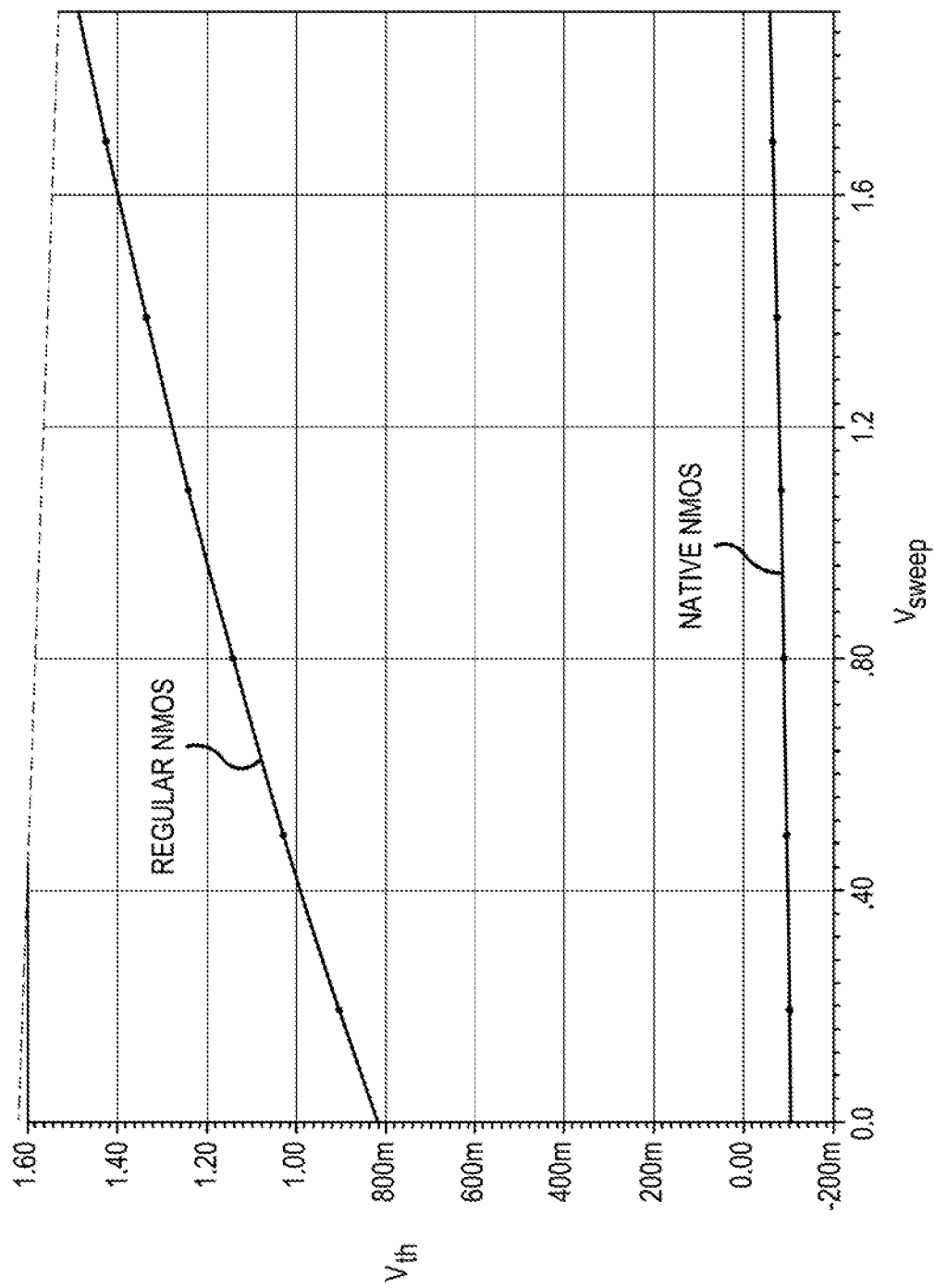
FIG. 10 is a graph illustrating the variation of threshold voltage for a regular non-native NMOS and for a native NMOS.

FIG. 10 is a graph illustrating the variation of threshold voltage for a regular non-native NMOS and for a native NMOS. The y-axis represents the threshold voltage and the x-axis represents source to bulk voltage (VSB). As illustrated by the two curves in FIG. 10, native NMOS shows a much smaller variation in threshold voltage with VSB.

Figure 11B:
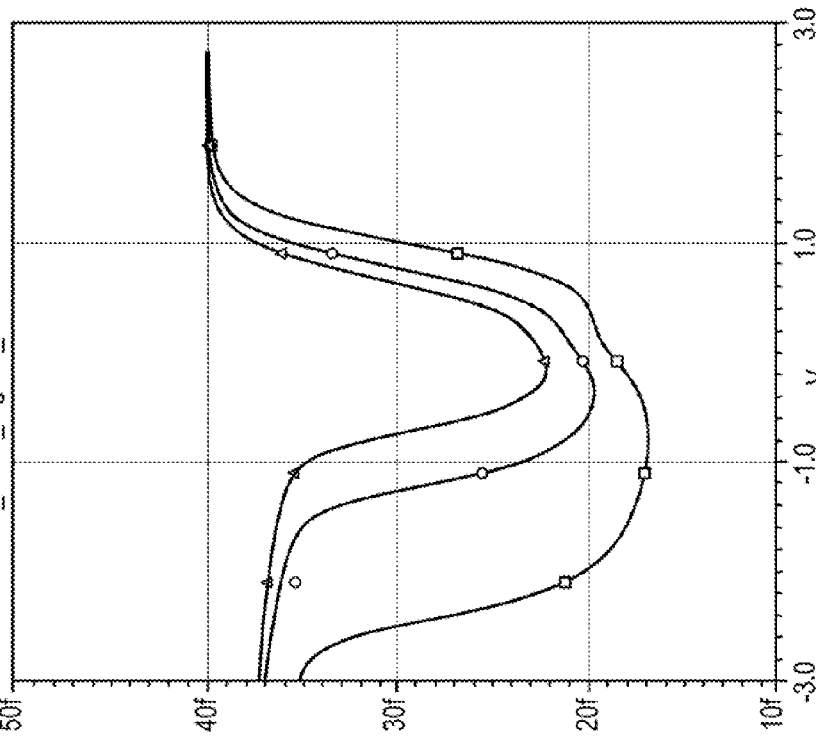
FIG. 11B is a graph illustrating CV curves ($C_{gg}$ versus $V_{gs}$) for a regular (non-native) NMOS transistor.
Figure 11A:
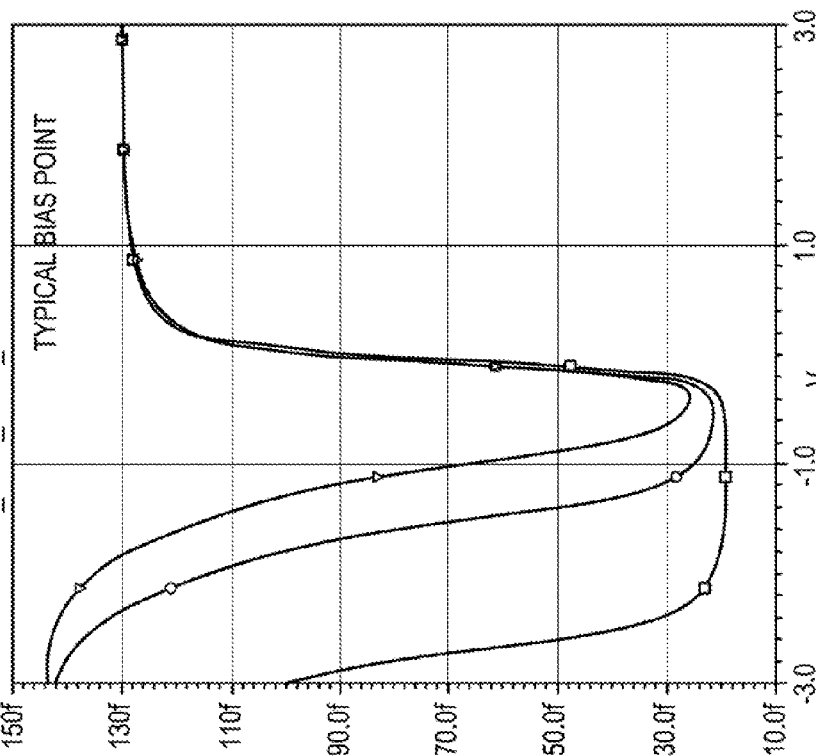
FIG. 11A is a graph illustrating CV curves ($C_{gg}$ versus $V_{gs}$) for a native MOS differential neutralization capacitor.

FIGS. 11A and 11B are graphs illustrating CV curves ($C_{gg}$ versus $V_{gs}$) for native MOS differential neutralization capacitor (FIG. 11A) and for a regular (non-native) NMOS transistor (FIG. 11B). In the normal region of operation for the differential neutralization capacitor ($V_{gs}>0$) the native MOS DN shows much smaller change in capacitance curves versus VGS for various VSBs. Native MOSDN shows lower sensitivity of CV curves to back gate effect ($V_{sb}$) signal swing compared to regular MOSDN.

While example embodiments are disclosed herein, one of ordinary skill in the art appreciates that many variations that are in accordance with the present teachings are possible and remain within the scope of the appended claims. The embodiments therefore are not to be restricted except within the scope of the appended claims.

The invention claimed is:

1. An apparatus, comprising:
   a first positive channel metal oxide semiconductor (PMOS) transistor having a source connected to a first node, a drain connected to a second node, and a gate connected to a third node;
   a second PMOS transistor having a source connected to the first node, a drain connected to a fourth node, and a gate connected to a fifth node;
   a first negative channel metal oxide semiconductor (NMOS) transistor having a source connected to a sixth node, a drain connected to the second node, and a gate connected to a seventh node;
   a second NMOS transistor having a source connected to the sixth node, a drain connected to the fourth node, and a gate connected to an eighth node;
   a first metal oxide semiconductor (MOS) differential neutralization device connected between the third node and the fourth node;
   a second MOS differential neutralization device connected between the fifth node and the second node;
   a third MOS differential neutralization device connected between the seventh node and the fourth node; and
   a fourth MOS differential neutralization device connected between the eighth node and the second node, wherein the first through fourth MOS differential neutralization devices comprise PMOS capacitors.

2. The apparatus of claim 1, wherein each of the PMOS capacitors has a bulk connected to a power supply voltage.

3. The apparatus of claim 1, wherein the first and second MOS differential neutralization devices together comprise either NMOS or PMOS capacitors, and the third and fourth MOS differential neutralization devices together comprise either NMOS or PMOS capacitors.

4. The apparatus of claim 1, wherein the first node is connected to a supply voltage and the sixth node is connected to ground.

5. The apparatus of claim 1, wherein at least one of the first through fourth differential neutralization devices comprises an oxide layer formed in conjunction with an oxide layer of at least one of the first PMOS transistor, the second PMOS transistor, the first NMOS transistor, the second NMOS transistor.

6. The apparatus of claim 1, wherein the first and second PMOS transistors and the first and second NMOS transistors form an H-bridge.

7. The apparatus of claim 1, wherein the first and second PMOS transistors and the first and second NMOS transistors form a differential amplifier.

8. An apparatus, comprising:
   a differential amplifier comprising first and second metal oxide semiconductor (MOS) transistors arranged in parallel, the first MOS transistor comprising a gate that receives a positive input signal among a differential pair of input signals, a drain that outputs a negative output signal among a differential pair of output signals, and a source connected to a reference voltage, and the second MOS transistor comprising a gate that receives a negative input signal among the differential pair of input signals, a drain that outputs a positive output signal among the differential pair of output signals, and a source connected to the reference voltage;

a first MOS differential neutralization device connected between the gate of the first MOS transistor and the drain of the second MOS transistor; and a second MOS differential neutralization device connected between the gate of the second MOS transistor and the drain of the first MOS transistor, wherein the first and second MOS differential neutralization devices each comprise a positive channel metal oxide semiconductor (PMOS) transistor.

9. The apparatus of claim 8, wherein each of the first and second MOS devices comprises an NMOS transistor or a PMOS transistor.

10. The apparatus of claim 8, wherein the differential amplifier further comprises additional MOS transistors arranged with the first and second MOS transistors in an H-bridge configuration.

11. An apparatus, comprising:
a first positive channel metal oxide semiconductor (PMOS) transistor having a source connected to a first node, a drain connected to a second node, and a gate connected to a third node;
a second PMOS transistor having a source connected to the first node, a drain connected to a fourth node, and a gate connected to a fifth node;
a first negative channel metal oxide semiconductor (NMOS) transistor having a source connected to a sixth node, a drain connected to the second node, and a gate connected to a seventh node;
a second NMOS transistor having a source connected to the sixth node, a drain connected to the fourth node, and a gate connected to an eighth node;
a first metal oxide semiconductor (MOS) differential neutralization device connected between the third node and the fourth node;
a second MOS differential neutralization device connected between the fifth node and the second node;
a third MOS differential neutralization device connected between the seventh node and the fourth node; and
a fourth MOS differential neutralization device connected between the eighth node and the second node, wherein the first through fourth MOS differential neutralization devices comprise NMOS capacitors.

12. The apparatus of claim 11, wherein each of the NMOS capacitors has a bulk connected to ground.

13. The apparatus of claim 11, wherein the first and second PMOS transistors and the first and second NMOS transistors form an H-bridge.

14. The apparatus of claim 11, wherein the first and second PMOS transistors and the first and second NMOS transistors form a differential amplifier.

15. The apparatus of claim 11, wherein the first node is connected to a supply voltage and the sixth node is connected to ground.

16. The apparatus of claim 11, wherein at least one of the first through fourth differential neutralization devices comprises an oxide layer formed in conjunction with an oxide layer of at least one of the first PMOS transistor, the second PMOS transistor, the first NMOS transistor, the second NMOS transistor.

17. An apparatus, comprising:
a first positive channel metal oxide semiconductor (PMOS) transistor having a source connected to a first node, a drain connected to a second node, and a gate connected to a third node;
a second PMOS transistor having a source connected to the first node, a drain connected to a fourth node, and a gate connected to a fifth node;
a first negative channel metal oxide semiconductor (NMOS) transistor having a source connected to a sixth node, a drain connected to the second node, and a gate connected to a seventh node;
a second NMOS transistor having a source connected to the sixth node, a drain connected to the fourth node, and a gate connected to an eighth node;
a first metal oxide semiconductor (MOS) differential neutralization device connected between the third node and the fourth node;
a second MOS differential neutralization device connected between the fifth node and the second node;
a third MOS differential neutralization device connected between the seventh node and the fourth node; and
a fourth MOS differential neutralization device connected between the eighth node and the second node, wherein the first through fourth MOS differential neutralization devices comprise NMOS capacitors, wherein the first and second MOS differential neutralization devices together comprise either NMOS or PMOS capacitors, and the third and fourth MOS differential neutralization devices together comprise either NMOS or PMOS capacitors.

18. The apparatus of claim 17, wherein the first and second PMOS transistors and the first and second NMOS transistors form an H-bridge.

19. The apparatus of claim 17, wherein the first and second PMOS transistors and the first and second NMOS transistors form a differential amplifier.

20. The apparatus of claim 17, wherein the first node is connected to a supply voltage and the sixth node is connected to ground.

21. The apparatus of claim 17, wherein at least one of the first through fourth differential neutralization devices comprises an oxide layer formed in conjunction with an oxide layer of at least one of the first PMOS transistor, the second PMOS transistor, the first NMOS transistor, the second NMOS transistor.

22. An apparatus, comprising:
a first positive channel metal oxide semiconductor (PMOS) transistor having a source connected to a first node, a drain connected to a second node, and a gate connected to a third node;
a second PMOS transistor having a source connected to the first node, a drain connected to a fourth node, and a gate connected to a fifth node;
a first negative channel metal oxide semiconductor (NMOS) transistor having a source connected to a sixth node, a drain connected to the second node, and a gate connected to a seventh node;
a second NMOS transistor having a source connected to the sixth node, a drain connected to the fourth node, and a gate connected to an eighth node;
a first metal oxide semiconductor (MOS) differential neutralization device connected between the third node and the fourth node;
a second MOS differential neutralization device connected between the fifth node and the second node;

a third MOS differential neutralization device connected between the seventh node and the fourth node; and a fourth MOS differential neutralization device connected between the eighth node and the second node, wherein each of the first through fourth MOS differential neutralization devices is a native MOS device.

23. An apparatus, comprising:

a differential amplifier comprising first and second metal oxide semiconductor (MOS) transistors arranged in parallel, the first MOS transistor comprising a gate that receives a positive input signal among a differential pair of input signals, a drain that outputs a negative output signal among a differential pair of output signals, and a source connected to a reference voltage, and the second MOS transistor comprising a gate that receives a negative input signal among the differential pair of input signals, a drain that outputs a positive output signal among the differential pair of output signals, and a source connected to the reference voltage;

a first MOS differential neutralization device connected between the gate of the first MOS transistor and the drain of the second MOS transistor; and a second MOS differential neutralization device connected between the gate of the second MOS transistor and the drain of the first MOS transistor, wherein the first and second MOS differential neutralization devices is a native MOS device.

* * * * *